United States Patent
Erkens

(10) Patent No.: US 9,989,569 B2
(45) Date of Patent: Jun. 5, 2018

(54) ELECTRODE CONFIGURATION FOR A CAPACITIVE SENSOR DEVICE AND A CAPACITIVE SENSOR DEVICE FOR THE DETECTION OF AN APPROXIMATION

(75) Inventor: Holger Erkens, Düsseldorf (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 503 days.

(21) Appl. No.: 13/984,112

(22) PCT Filed: Feb. 6, 2012

(86) PCT No.: PCT/EP2012/051982
§ 371 (c)(1),
(2), (4) Date: Feb. 17, 2014

(87) PCT Pub. No.: WO2012/107415
PCT Pub. Date: Aug. 16, 2012

(65) Prior Publication Data
US 2014/0176160 A1 Jun. 26, 2014

(30) Foreign Application Priority Data
Feb. 7, 2011 (DE) .......... 10 2011 003 734

(51) Int. Cl.
G01R 27/26 (2006.01)
H03K 17/955 (2006.01)
H03K 17/96 (2006.01)

(52) U.S. Cl.
CPC ....... G01R 27/2605 (2013.01); H03K 17/955 (2013.01); H03K 17/9622 (2013.01);
(Continued)

(58) Field of Classification Search
CPC .. G01R 27/26; G01R 27/2605; H03K 17/955; H03K 17/9622; H03K 2217/96066; H03K 2217/96077
(Continued)

(56) References Cited

U.S. PATENT DOCUMENTS 7,352,355 B2 * 4/2008 Troxell et al. ................ 345/156
7,556,204 B2 * 7/2009 Jacobsen .............. G06F 1/1626
235/375
(Continued)

FOREIGN PATENT DOCUMENTS

CN 101246258 A 8/2008 ............... B81B 3/00
CN 101663638 A 3/2010 ............. G06F 3/044
(Continued)

OTHER PUBLICATIONS

International Search Report and Written Opinion, Application No. PCT/EP2012/051982, 11 pages, dated Apr. 20, 2012.
(Continued)

Primary Examiner — Melissa Koval
Assistant Examiner — Rahul Maini
(74) Attorney, Agent, or Firm — Slayden Grubert Beard PLLC

(57) ABSTRACT

An electrode configuration for a capacitive sensor device has a transmitting electrode and a receiving electrode, wherein the transmitting electrode can be brought into a capacitive coupling with the receiving electrode, wherein the electrode configuration has at least one first and second sensor area, wherein both of the electrode surfaces of the transmitting electrode and of the receiving electrode in the first sensor area are small compared to the electrode surfaces of the transmitting electrode and of the receiving electrode in the second sensor area. A capacitive sensor device for the detection of an approximation may have such an electrode
(Continued)

configuration. An electrical device, particularly an electrical hand-held device, may have at least one such capacitive sensor device.

25 Claims, 6 Drawing Sheets

(52) U.S. Cl.
 CPC .............. *H03K 2217/96066* (2013.01); *H03K 2217/960775* (2013.01)

(58) Field of Classification Search
 USPC ........................... 324/658–690; 345/173–174
 See application file for complete search history.

(56) References Cited

U.S. PATENT DOCUMENTS

| | | | | |
|---|---|---|---|---|
| 7,659,652 | B2 | 2/2010 | Kato et al. ..................... | 310/309 |
| 7,808,255 | B2 | 10/2010 | Hristov et al. ................ | 324/686 |
| 8,212,791 | B2 | 7/2012 | Kusuda et al. ............... | 345/173 |
| 8,514,189 | B2* | 8/2013 | Wu ....................... | G06F 3/0412 |
| | | | | 178/18.06 |
| 8,638,107 | B2* | 1/2014 | Schwartz et al. ............. | 324/658 |
| 9,130,571 | B2* | 9/2015 | Thoma ............... | H03K 17/9622 |
| 2008/0246496 | A1 | 10/2008 | Hristov et al. ................ | 324/686 |

FOREIGN PATENT DOCUMENTS

| | | | | |
|---|---|---|---|---|
| CN | 101842767 A | 9/2010 | ............. | G06F 3/041 |
| EP | 1033578 A2 | 9/2000 | ............. | G01P 13/04 |
| EP | 1418491 A2 | 5/2004 | ............. | G06F 3/033 |
| WO | 2012/107415 A1 | 8/2012 | ........... | H03K 17/955 |

OTHER PUBLICATIONS

Chinese Office Action, Application No. 201280011593.0, 9 pages, dated Sep. 8, 2015.
European Office Action, Application No. 12704031.9, 6 pages, dated Sep. 5, 2016.
Chinese Office Action, Application No. 201280011593.0, 12 pages, dated May 31, 2016.
Chinese Decision of Rejection, Application No. 201280011593.0, 13 pages, dated Jan. 24, 2017.
Chinese Office Action, Application No. 201280011593.0, 3 pages, dated Aug. 14, 2017.
Korean Office Action, Application No. 20137023570, 11 pages, dated Aug. 10, 2017.

* cited by examiner

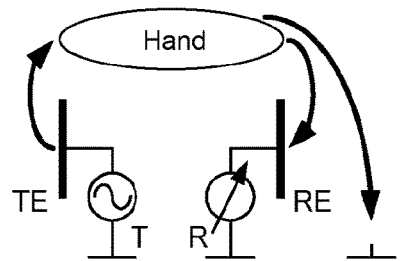
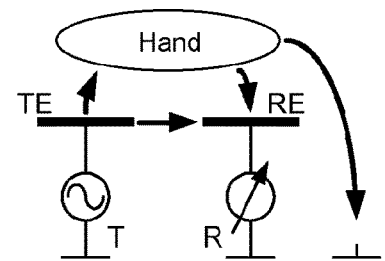
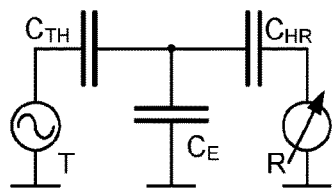
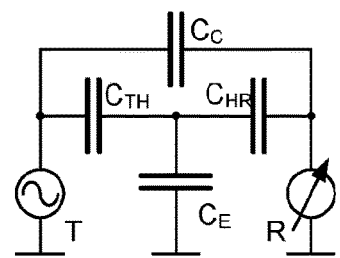
Fig. 1a
Fig. 1b
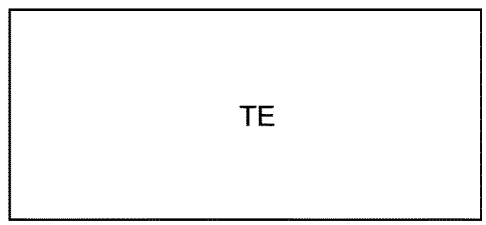
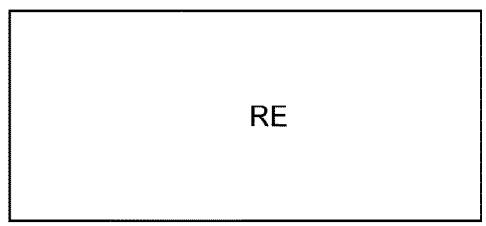
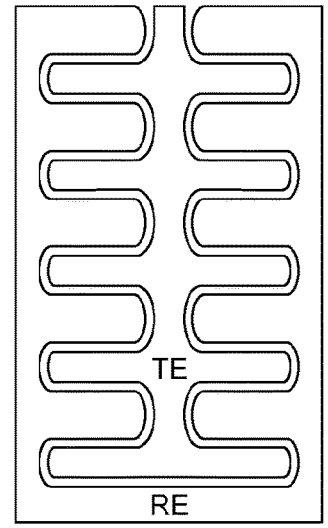
Fig. 2a
Fig. 2b

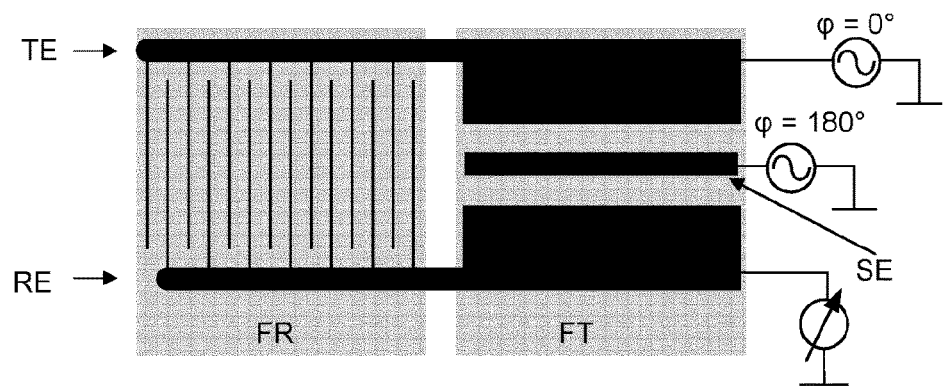
Fig. 5
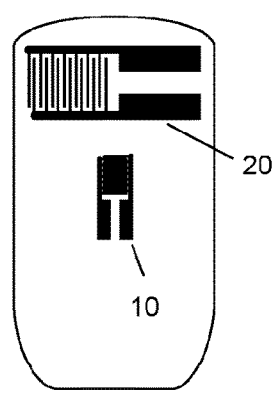 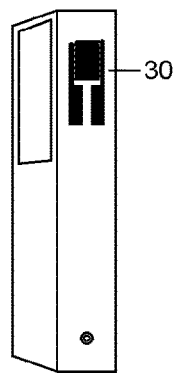 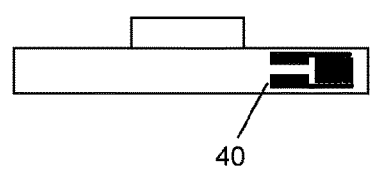
Fig. 6a    Fig. 6b    Fig. 6c

ELECTRODE CONFIGURATION FOR A CAPACITIVE SENSOR DEVICE AND A CAPACITIVE SENSOR DEVICE FOR THE DETECTION OF AN APPROXIMATION

CROSS-REFERENCE TO RELATED APPLICATIONS

This application is a U.S. National Stage Application of International Application No. PCT/EP2012/051982 filed Feb. 6, 2012, which designates the United States of America, and claims priority to DE Application No. 10 2011 003 734.9 filed Feb. 7, 2011, the contents of which are hereby incorporated by reference in their entirety.

TECHNICAL FIELD

The invention relates to an electrode configuration for a capacitive sensor device as well as a capacitive sensor device with an electrode configuration according to the present invention for the detection of an approximation, particularly for the detection of an approximation of an object to the electrode configuration of the capacitive sensor device. Furthermore, the present invention relates to an electrical device, particularly an electrical hand-held device, which comprises at least one capacitive sensor device according to the present invention.

BACKGROUND

In case of capacitive approximation sensors, the approximation of an object to a sensor zone is substantially measured without contact by generating and measuring alternating electrical fields. Functions, such as switching functions, of an electrical device, particularly of an electrical hand-held device, can be derived from the measuring signal.

A measuring principle known from prior art for the detection of an approximation to a sensor zone uses a capacitive approximation sensor with two sensor electrodes. The sensor electrodes of the capacitive approximation sensor can be coupled capacitively, i.e. an alternating electrical field is emitted at a sensor electrode, which couples into the other sensor electrode via an approximating object in case an object approximates to the sensor electrodes. This way, a capacitive path is generated between a transmitter and a receiver. This method is generally known as transmission method. Two electrodes form a sensor zone.

There is a need to provide several sensor zones, for instance, at an electrical hand-held device, wherein each sensor zone has a different function or functionality in case an object approximates to a sensor zone. The sensor devices known from prior art, which are operated according to the transmission method mentioned before, require two electrodes for each sensor zone. This means that n sensor zones require twice the number (n) of sensor electrodes.

The transmission method known from prior art proves to be disadvantageous, since each sensor zone which requires two sensor electrodes, respectively, requires a separate or multiplexed transmitting and receiving path in addition to the required electric circuit required for this, which particularly has an impact on the power consumption of a capacitive sensor device being used to monitor several sensor zones. Furthermore, an individual transmission measuring has to be performed for each sensor zone in order to detect an approximation to the respective sensor zone as far as the transmission method known from prior art is concerned.

SUMMARY

According to various embodiments, an electrode configuration can be provided for a capacitive sensor device as well as a capacitive sensor device with a corresponding electrode configuration for the detection of an approximation, which at least partially avoid the disadvantages known from prior art and which enable to reduce the circuit complexity or the circuit costs, the power consumption and the costs for the electrodes for the detection of an approximation of an object, particularly when providing several sensor zones.

According to various embodiments. an electrode configuration for a capacitive sensor device may comprise a transmitting electrode and a receiving electrode, wherein the transmitting electrode can be brought into a capacitive coupling with the receiving electrode, wherein the electrode configuration comprises at least one first sensor area and at least one second sensor area, wherein both of the electrode surfaces of the transmitting electrode and of the receiving electrode in the first sensor area are small compared to the electrode surfaces of the transmitting electrode and of the receiving electrode in the second sensor area.

The number of sensor electrodes for providing a number of sensor areas can be considerably reduced compared to the known sensor solutions. The number of the required lines can also be considerably reduced by this. Both results in considerably lower manufacturing costs. In addition to that, providing a number of sensor areas requires less space, which is particularly advantageous in case of small electrical devices (e.g. cell phones). Furthermore, the power and energy consumption can be reduced considerably since the number of measurings can be reduced. An electrode configuration according to various embodiments particularly enables to detect towards which of the two sensor areas an approximation or touch has taken place by means of one single measuring. According to further embodiments, the distance between the transmitting electrode and the receiving electrode in the first sensor area is selected in such a way that the electrode configuration in the first sensor area shows a high capacitive basic coupling, and when the distance between the transmitting electrode and the receiving electrode in the second sensor area is selected in such a way that the electrode configuration in the second sensor area shows a capacitive basic coupling which is lower than the capacitive basic coupling in the first sensor area.

According to further embodiments, the transmitting electrode and the receiving electrode are each configured in a comb-shaped manner in the first sensor area, wherein the transmitting electrode is arranged relatively to the receiving electrode in such a way that the comb teeth of the transmitting electrode are substantially arranged between the comb teeth of the receiving electrode.

The electrode configuration may furthermore comprise a shielding electrode, which is substantially arranged between the transmitting electrode and the receiving electrode, preferably in the second sensor area.

According to other embodiments, a capacitive sensor device for the detection of an approximation, comprising at least one electrode configuration, particularly an electrode configuration according as described above, wherein
 the electrode configuration comprises
  a transmitting electrode, at which an alternating electrical field can be emitted, and
  a receiving electrode, into which the alternating electrical field can couple and at which an electrical signal can be tapped, the electrode configuration comprises at least one first sensor area and at least one second sensor area, and the transmitting electrode and the receiving electrode are configured in such a way and can be arranged relatively to one another in such a way that an approximation of an object to the first sensor area results in a level reduction and to the second sensor area results in a level increase of the electrical signal which can be tapped at the receiving electrode.

According to further embodiments of the above sensor device, in the first sensor area a first section of the alternating electrical field and in the second sensor area a second section of the alternating electrical field is formed between the transmitting electrode and the receiving electrode.

The distance between the transmitting electrode and the receiving electrode in the first sensor area can be selected in such a way that the electrode configuration in the first sensor area shows a high capacitive basic coupling.

The distance between the transmitting electrode and the receiving electrode in the second sensor area can be selected in such a way that the electrode configuration in the second sensor area substantially shows a capacitive basic coupling which is lower than the capacitive basic coupling in the first sensor area.

The transmitting electrode and the receiving electrode can be substantially configured having a planar (flat) surface, wherein both of the electrode surfaces of the transmitting electrode and of the receiving electrode in the first sensor area are small compared to the electrode surfaces of the transmitting electrode and of the receiving electrode in the second sensor area.

The distance between the transmitting electrode and the receiving electrode in the first sensor area may be small compared to the distance between the transmitting electrode and the receiving electrode in the second sensor area. The transmitting electrode and the receiving electrode can each be configured in a comb-shaped manner in the first sensor area, wherein the comb teeth of the transmitting electrode are arranged between the comb teeth of the receiving electrode, and wherein the transmitting electrode and the receiving electrode are each configured in a rectangular manner in the second sensor area, wherein the backs of the comb are each substantially arranged at right angles to the respective electrode.

The transmitting electrode and the receiving electrode may each comprise a large area and a small area, wherein the small area is substantially configured as marginal extension at the large area (as shown in FIG. 11). The large area may substantially comprise a rectangular shape. The small area may substantially be strip-shaped. The large area and the small area are arranged to one another in such a way that in case of a substantially mirror inverted arrangement of the electrodes along an axis of reflection, the distance between the small areas to one another is smaller than the distance between the large areas to one another.

A shielding electrode can be arranged between the transmitting electrode and the receiving electrode, wherein a first alternating electrical signal can be applied to the transmitting electrode and a second alternating electrical signal can be applied to the shielding electrode, wherein the first alternating electrical signal has a phase difference of 180° with regard to the second alternating electrical signal.

The shielding electrode can be arranged between the transmitting electrode and the receiving electrode in the second sensor area.

Furthermore, according to other embodiments an electrical device, particularly an electrical hand-held device, may comprise at least one capacitive sensor device as described above.

The electrical device or electrical hand-held device can be a smartphone, a mobile radio unit, a computer mouse, a remote control for a device, a digital camera, a game controller, a personal digital assistant, a tablet PC, a hearing device, a dictaphone, a media player or the like.

BRIEF DESCRIPTION OF THE DRAWINGS

Further details and features can be taken from the following description in combination with the drawings. The drawings show:

FIG. 1a a schematic circuit configuration in order to explain a transmission method according to various embodiments as well as the corresponding equivalent circuit diagram;

FIG. 1b a schematic circuit configuration in order to explain a reduction method according to various embodiments as well as the corresponding equivalent circuit diagram;

FIG. 2a an example of two sensor electrodes for the use in a transmission method;

FIG. 2b an example of two sensor electrodes for the use in a reduction method;

FIG. 5 the electrode configuration or electrode geometry shown in FIG. 3 with an additional shielding electrode;

FIG. 6a to FIG. 6c examples of the use of one or more electrode configuration(s) for different electrical hand-held devices, wherein each electrode configuration provides two sensor areas or sensor zones;

DETAILED DESCRIPTION

Figure 3:
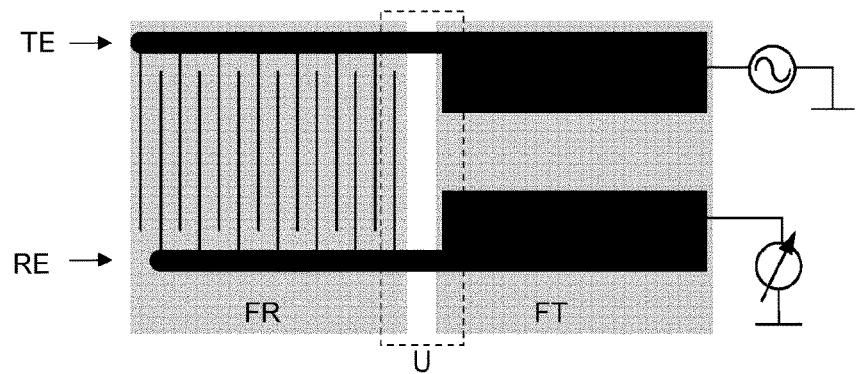
FIG. 3 an example of an electrode geometry of two electrodes, thus implementing two sensor zones.

FIG. 1a and FIG. 1b each show a schematic circuit configuration in order to explain the transmission method or reduction method used in a capacitive sensor device or in an electrode configuration according to various embodiments as well as the corresponding equivalent circuit diagrams.

In the circuit configuration with a transmitting electrode TE and a receiving electrode RE according to FIG. 1a, an alternating electrical signal, being provided by a signal generator, is applied to the transmitting electrode TE. An alternating electrical field is emitted at the transmitting electrode TE. In case of an approximation, such as of a hand H to the sensor electrodes TE, RE, the alternating electrical field emitted at the transmitting electrode TE is coupled into the receiving electrode RE via the hand so that a capacitive path is generated between the transmitter T and the receiver R. In case of an approximation of a hand H to the sensor electrodes, an electrical signal tapped at the receiving electrode RE changes, wherein the change of the tapped electrical signal indicates the approximation of the hand H to the sensor electrodes. In the equivalent circuit diagram shown in FIG. 1a, the capacity $C_{TH}$ represents the capacity from the transmitting electrode TE to the hand H, the capacity $C_{HR}$ represents the capacity from the hand H to the receiving electrode RE and the capacity $C_E$ represents the ground capacity of the body.

It may be advantageous for the transmission method according to various embodiments, when the transmitting electrode TE and the receiving electrode RE each comprise a large electrode surface and have a distance to one another with a, on the one hand, low capacitive basic coupling between transmitting electrode and receiving electrode, and, on the other hand, which facilitate and ensure a good capacitive coupling between a body approximating to the sensor electrodes and the electrode surfaces of the sensor electrodes.

In case of a hand approximating to the sensor electrodes, the capacities $C_{TH}$ and $C_{HR}$ from the transmitting electrode TE to the hand H or from the hand H to the receiving electrode RE increase. The approximation of a hand H to the sensor electrodes also leads to an increase of the capacitive coupling between the transmitter T and the receiver R or between the transmitting electrode TE and the receiving electrode RE. Due to the changing capacitive coupling between the transmitting electrode TE and the receiving electrode RE, the signal level of the electrical signal tapped at the receiving electrode RE also changes. Preferably, the signal level increases.

The electrode surfaces of the transmitting electrode TE and the receiving electrode RE and/or the distance between the two electrodes are preferably selected in such a way that that the signal level of the electrical signal tapped at the receiving electrode RE is minimum in case of no hand H approximating to the electrodes and the signal change of the tapped signal is maximum in case of an approximating or completely approximated hand.

An advantageous configuration or embodiment of a transmitting electrode TE and of a receiving electrode RE is shown with reference to FIG. 2a. The electrodes TE and RE are configured having a planar surface and each comprise a large electrode surface. Furthermore, the electrodes TE, RE are arranged at a large distance to one another. The rectangular shape of the electrodes TE or RE only serves as example. Other electrode shapes or electrode geometries are possible, too, provided that in case of a corresponding distance of the electrodes there is a capacitive basic coupling as low as possible and in case of an approximating hand there is a level change as high as possible of the electrical signal tapped at the receiving electrode.

FIG. 1b shows a schematic circuit configuration as well as the corresponding equivalent circuit diagram in order to explain a reduction method with an electrode configuration according to various embodiments.

An alternating electrical signal is applied to the transmitting electrode TE in order to generate a capacitive coupling between the transmitting electrode TE and the receiving electrode RE. It is advantageous for the reduction method to select electrodes with a small surface and to select the distance between the electrodes in such a way that a relatively high capacitive basic coupling is enabled between the transmitting electrode TE and the receiving electrode RE. This means that there is a small distance between the two electrodes. Due to the high basic coupling, the electrical signal tapped at the receiving electrode RE shows a certain signal level even in case of no approximation to the sensor electrodes, such as by a hand, which preferably is higher than a signal level in case of an electrode configuration according to FIG. 1a or FIG. 2b without an approximating hand.

The additional capacity $C_C$ of the equivalent circuit diagram represents the capacitive basic coupling between the transmitting electrode TE and the receiving electrode RE. When a hand H approximates to the sensor electrodes, a relatively low capacitive coupling is generated via the hand H (capacities $C_{TH}$ and $C_{HR}$) since the electrode surfaces are small and the hand H partially discharges the signal transmitted via the body bridge via $C_E$ to the device ground.

However, the effect that the hand H approximating to the sensor electrodes reduces the existing capacitive ground coupling $C_C$ between the transmitting electrode TE and the receiving electrode RE is much more pronounced. The reduction of the capacitive basic coupling $C_C$ in case of an approximating hand H is the consequence of that the space and thus the effective capacitor surface is reduced in case of an approximation. However, the approximating hand results in the generation of a body bridge between the sensor electrodes, which partially compensates for the reduction of the capacitive basic coupling mentioned before. However, the geometry of the electrodes and the distance of the electrodes to one another are to be selected in such a way that already a low coupling between the person and the device ground is sufficient in order to short the body bridge to the device ground.

A capacity of a few pF between the person and the device ground is sufficient for this. Due to the shorting of the body bridge to the device ground, the reduction becomes stronger in case a hand approximates to the sensor electrodes.

This means that the electrical signal tapped at the receiving electrode RE has an adjustable basic level in case of no hand approximating to the electrodes, which is reduced in case of an approximating hand. The basic level can be changed, for example by changing the capacitive basic coupling between the transmitting electrode TE and the receiving electrode RE, which can be achieved by different electrode geometries or different distances between the electrodes.

An electrode design or an electrode configuration, which is suitable for the reduction method according to various embodiments is shown with reference to FIG. 2b. The electrodes each comprise small electrode surfaces. Furthermore, there is a small distance between the electrodes. The small surface of the electrodes reduces the effect of the body bridge mentioned before, whereas the small distance increases the capacitive basic coupling between the sensor electrodes. Such a selection of an electrode surface or of an electrode distance can be advantageous in case of touch or approximation sensors in electrical devices with a low coupling between the person and the device ground. The distance of the electrodes is to be optimized taking into consideration the nonconductive layers arranged above the electrodes (such as a device housing) to maximum change in case of a hand approximating to the electrode surface.

The respective electrode surfaces or electrode distances are to be adjusted according to the requirements not only for the transmission method according to various embodiments, as explained with reference to FIG. 1b, but also for the reduction method according to various embodiments, as explained with reference to FIG. 1b, in order to obtain a capacitive basic coupling as low as possible and a level change as high as possible in case of an approximating hand for the transmission method and a capacitive basic coupling as good as possible and a level change as high as possible in case of an approximating hand for the reduction method.

FIG. 3 shows an electrode configuration according to various embodiments with two electrodes, which can be used to implement or to put into effect not only the transmission method but also the reduction method.

The electrode configuration comprises one first sensor electrode, which is used as transmitting electrode TE, and one second sensor electrode, which is used as receiving electrode. The transmitting electrode TE and the receiving electrode RE are configured in a comb-shaped manner and are arranged relatively to one another in such a way that the comb teeth of the transmitting electrode TE are arranged between the comb teeth of the receiving electrode RE. The area comprising the comb teeth represents a first sensor area and the area comprising the comb handles represents a second sensor area.

An alternating electrical signal is applied to the transmitting electrode TE so that it emits an alternating electrical field, which can couple into the receiving electrode RE. A first section FR of the alternating electrical field is formed in the first sensor area (in the area of the comb teeth) and a second section FT of the alternating electrical field is formed in the second sensor area (in the area of the comb handles).

It is important that the electrode surfaces in the first sensor area (in the area of the comb teeth) are small, respectively, and that the distance between the electrodes in the first sensor area is also small so that the reduction effect mentioned before is obtained in the first sensor area or in the area comprising the first section FR of the alternating electrical field. This means that the electrical signal tapped at the receiving electrode RE is reduced or that the signal level is reduced when a hand or a finger approximates to the first sensor area of the electrode configuration shown in FIG. 3.

Furthermore, it is important that the electrode surfaces in the second sensor area (in the area of the comb handles) are large and that the distance between the electrodes is also selected that large that the conditions, being explained with reference to FIG. 1a, can be achieved. When a finger or a hand approximates to the second sensor area, a transmission effect is achieved so that the signal level of the electrical signal tapped at the receiving electrode increases according to the transmission method described before.

This way, an electrode configuration is provided, comprising only two sensor electrodes (transmitting electrode TE and receiving electrode RE) and enabling the implementation of two sensor zones, whereas solutions known from prior art would require at least four electrodes (two electrodes per sensor zone). Furthermore, the electrode configuration according to various embodiments only requires a signal generator and a receiving path, which has a positive impact on the circuit complexity and the circuit costs. Only one single measuring is required to determine whether an approximation has taken place towards the first sensor area or towards the second sensor area. Furthermore, the power consumption of a capacitive sensor device with an electrode configuration according to various embodiments with two electrodes can be considerably reduced compared to a capacitive sensor device, which requires at least four electrodes for two sensor zones.

In a small area U, the transmission and the reduction substantially cancel each other so that there is no clear distinction between "an approximation in this area U" and "no approximation to the sensor electrodes". However, an appropriate embodiment of the electrode geometries can help to minimize this area U.

Also in case of a simultaneous and substantially constant approximation towards the two sensor electrodes, there sometimes is no clear distinction between "an approximation in this area U" and "no approximation to the sensor electrodes". This behavior can also be minimized or avoided by an appropriate embodiment of the electrodes or by an appropriate selection of the distance of the electrodes to one another.

Figure 4:
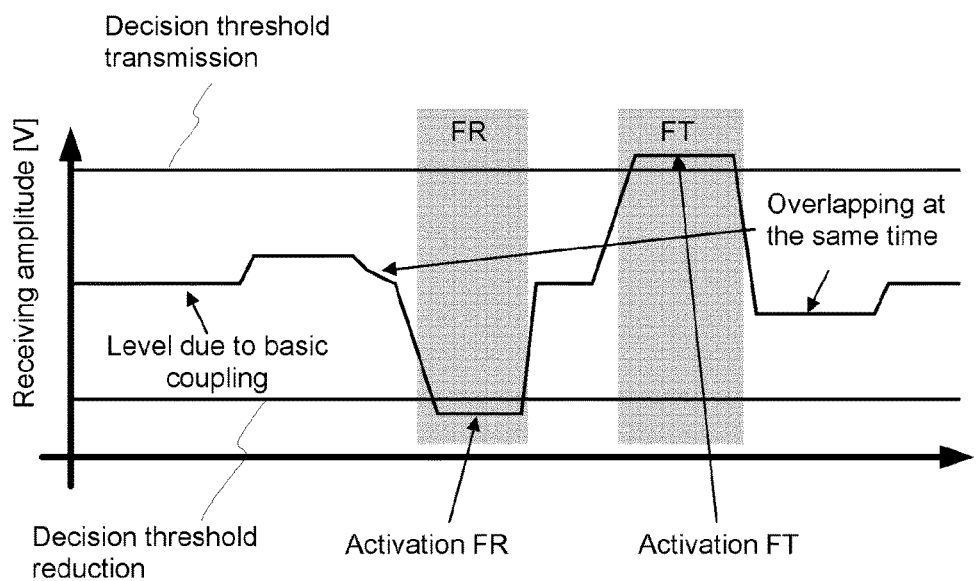
FIG. 4 the course of a signal amplitude of an electrical signal tapped at a receiving electrode over time in order to explain the difference between an approximation of an object to a first sensor zone and an approximation of an object to a second sensor zone of an electrode configuration according to various embodiments.

FIG. 4 shows possible signal courses of an electrical signal being tapped at the receiving electrode RE of an electrode configuration according to FIG. 3.

A certain level is obtained in the tapped signal without an approximation to the electrodes due to the existing capacitive basic coupling in the first sensor area (cf. explanation with reference to FIG. 1b). This level or basic level can be set by adjusting the electrode geometry in the first sensor area or by adjusting the distances of the electrodes to one another in the first sensor area.

It is advantageous to define threshold values in order to securely and reliably detect an approximation to the first sensor area or to the second sensor area. A first threshold value represents a decision threshold for the transmission and a second threshold value represents a decision threshold for the reduction.

When a hand approximates to the first sensor area FR, the signal level of the electrical signal tapped at the receiving electrode RE drops, as described with reference to FIG. 1b. When the signal level falls below the decision threshold for the reduction, an approximation to the first sensor area is detected. When a hand or a finger approximates to the second sensor area FT, this results in an increase of the level of the electrical signal tapped at the receiving electrode RE. When the signal level exceeds the decision threshold for the transmission, an approximation to the second sensor area is detected. When both sensor areas FT, FR are overlapped at the same time, for instance, by two fingers or when a finger approximates to the area U, the transmission and the reduction substantially cancel each other so that neither an approximation to the first sensor area nor an approximation to the second sensor area can be detected.

It is particularly advantageous to select the electrode geometries or the electrode distances in such a way that the signal deviation is maximized between reduction and transmission. This way, also the distance between the two decision thresholds can be maximized, which reduces the risk of an erroneous detection or a faulty activation.

Furthermore, it may be advantageous to create adjustable threshold values of the decision thresholds in order to enable a dynamic adaptation to the changing (capacitive) environmental conditions.

In addition to that, it may be advantageous to provide several decision thresholds for the transmission and/or several decision thresholds for the reduction. When a finger approximates to the first sensor area (in which the reduction effect is achieved), the value at first falls below a first decision threshold for the reduction and with further approximation, the value falls below a second decision threshold for the reduction. This also applies to the second sensor area.

As shown with reference to FIG. 3, the proposed electrode configurations are particularly suitable for applications with no simultaneous approximation to both sensor areas due to the application controlled by the sensor (for example in case of a volume control, where the approximation to the first sensor area leads to a reduction of the sound volume and the approximation to the second sensor area leads to an increase of the sound volume).

The electrode configuration or the capacitive sensor device according to various embodiments is particularly suitable for applications, where the approximation to both sensor areas or to both sections of the alternating electrical field must not be detected or analyzed simultaneously.

In case of changing ground references of electrical devices, it must also be ensured that a discharge of the measuring signal current via the person to the device ground is not that high that a significant transmission effect can no longer be detected.

FIG. 5 shows a further embodiment of an electrode configuration. A third electrode SE is provided in addition to the transmitting electrode TE and the receiving electrode RE. The electrode SE is arranged between the transmitting electrode and the receiving electrode in the area of the second sensor area and serves as shielding electrode. According to an embodiment, an alternating electrical signal is applied to the shielding electrode SE, which substantially has a phase difference of 180° with regard to the alternating electrical signal applied to the transmitting electrode TE. Thus, an existing capacitive basic coupling between the transmitting electrode and the receiving electrode can be reduced. This makes sense, for instance, when there is a very high basic coupling in the first sensor area between the transmitting electrode and the receiving electrode, which has to be corrected. This way, it is possible to simply adjust or set the basic level of the electrical signal tapped at the receiving electrode RE without having to change the electrode geometry or the electrode distances in the first sensor area.

It is also possible to arrange the shielding electrode SE in the area of the first sensor area.

FIG. 6a to FIG. 6c show possible examples of use of an electrode configuration or of a capacitive sensor device.

FIG. 6a shows a computer mouse comprising a first electrode configuration 10 and a second electrode configuration 20. As shown with reference to FIG. 3, a so-called scroll wheel is implemented in the first electrode configuration 10, substantially comprising two electrodes. Alternatively, a slider can be implemented instead of the scroll wheel. In the second electrode configuration 20, also comprising two electrodes, a left mouse button and a right mouse button are implemented, wherein the left mouse button is formed by the first sensor area and the right mouse button is formed by the second sensor area. In case of the first electrode configuration 10 shown in FIG. 6a, the signal analysis helps to detect towards which direction the finger is moved on the electrode configuration due to the order in which the decision threshold for the transmission was exceeded and in which the value fell below the decision threshold for the reduction.

FIG. 6b shows a media player, comprising an electrode configuration according to an embodiment 30 at a side wall. The electrode configuration 30 may, for instance, serve as volume control. The volume control can be implemented as a slider. For instance, a detection of an approximation to the first sensor area may result in an increase of the sound volume and a detection of an approximation to the second sensor area may result in a decrease of the sound volume.

FIG. 6c shows a digital camera as an example of use, comprising a so-called zoom toggle arranged at its housing wall, being put into effect by means of an electrode configuration 40. It is possible to distinguish between an approximation to the first sensor area and an approximation to the second sensor area although the electrode configuration comprises only two sensor electrodes.

Figure 7:
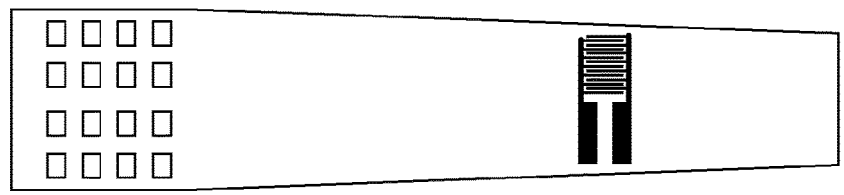
FIG. 7 an example of use of an electrode configuration or a sensor device for an electrical hand-held device, wherein only one single electrode configuration according to the present invention enables a left hand/right hand detection.

FIG. 7 shows a remote control as a further example of use of an electrode configuration, comprising an electrode configuration being arranged at the upper side of its housing perpendicular to the longitudinal axis of the remote control, as shown in FIG. 3. The electrode configuration reaches from one side of the housing to the opposite side of the housing. Since the capacitive coupling conditions for an operation of the remote control with the left hand are different from the capacitive coupling conditions for an operation of the remote control with the right hand, it can be distinguished between an operation of the remote control with the left hand and an operation of the remote control with the right hand by means of an arrangement of an electrode configuration according to an embodiment, as shown in FIG. 7. Depending on which hand holds the remote control, either the transmission or the reduction has more influence on the electrical signal tapped at the receiving electrode. The electrode configuration can also be configured in such a way that the electrodes at least partially reach to the two side walls of the housing of the remote control, which may enable an enhanced distinction between left and right.

Figure 8A:
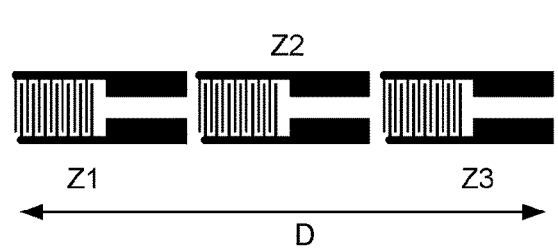
FIG. 8a an example of use with several electrode configurations in order to implement a so-called slider.

FIG. 8a shows a possible application or configuration of several electrode configurations in order to implement a so-called slider. Each electrode configuration forms a sensor zone Z1 to Z3, wherein each sensor zone Z1 to Z3 comprises two sensor areas due to the electrode configuration according to various embodiments. All in all, six sensor areas can be implemented by means of three electrode configurations according to various embodiments, wherein only six sensor electrodes are required. Due to the chronological sequence of the level increases or level decreases, the direction of movement D of a finger moving over the three electrode configurations can be determined.

The implementation of a slider with six sensor areas can also be performed according to various embodiments by means of four sensor electrodes. For instance, the three upper electrodes shown in FIG. 8a can be galvanically coupled so that these three electrodes substantially form one single electrode. This electrode can, for instance, be operated as transmitting electrode. The three lower electrodes can then, for instance, be operated as receiving electrode and be part of a corresponding receiving path, respectively. The receiving electrodes can be coupled to an analysis unit of the capacitive sensor via a multiplexer.

As an alternative, the receiving electrodes can also be coupled galvanically so that substantially there is only one single receiving electrode. An alternating electrical signal can be applied to each of the three transmitting electrodes in a time-division multiplexing.

Figure 8B:
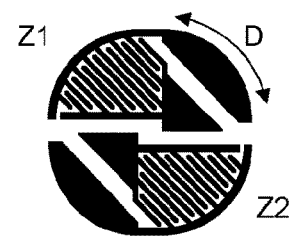
FIG. 8b an example of use with two electrode configurations in order to implement a so-called control knob.

FIG. 8b shows an application of two electrode configurations according to various embodiments, which are arranged to one another in such a way that a so-called control knob can be implemented. The electrode configuration also comprises a first sensor area and a second sensor area so that, all in all, four sensor areas are formed by the two electrode configurations. Due to the chronological sequence of the level increases or level decreases at the receiving electrode of the respective electrode configuration, it is possible to determine the direction of movement D. An alternative embodiment of an electrode configuration enabling the implementation of four sensor areas is shown with reference to FIG. 12.

The applications or embodiments of the electrode configurations shown before assume that a touch is detected when a value exceeds or falls below a threshold value. An alternative implementation of sliders or control knobs is shown in FIG. 9a and FIG. 9b.

Figure 9A:
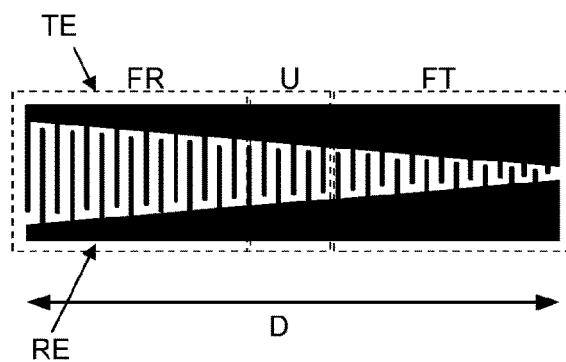
FIG. 9a an alternative embodiment of an electrode configuration, particularly in order to implement a so-called slider.

FIG. 9a shows an alternative implementation of a slider, using only an electrode configuration with a transmitting electrode TE and a receiving electrode RE. However, the sections FR and FT of the alternating electrical field are not spatially separated from one another, but they merge. The electrode surface continuously diminishes from the outer rim of the second sensor area (in FIG. 9a the right rim) towards the outer rim of the first sensor area (in FIG. 9a the left rim) so that the signal level of the electrical signal tapped at the receiving electrode also continuously decreases when a finger moves over the electrode configuration from the right to the left.

In an area U, the transmission effects and the reduction effects are balanced so that it is not possible to distinguish between "a finger applied" and "no finger applied" in this area. However, an appropriate configuration of the electrodes or the electrode distances can help to minimize this area U. As a matter of principle, the electrodes of the electrode configuration shown in FIG. 9a could also be configured in such a way that finally only one transmission effect can be measured over the entire area. However, a maximum change between the signal deviations on the right side and on the left side can be achieved by configuring the electrodes, as shown in FIG. 9a.

Figure 9B:
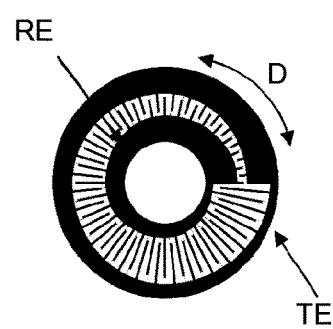
FIG. 9b a further alternative embodiment of an electrode configuration, particularly in order to implement a so-called control knob.

FIG. 9b shows an alternative embodiment of an electrode configuration with two electrodes in order to implement the control knob. The principle substantially corresponds to the electrode configuration shown in FIG. 9a.

Figure 10:
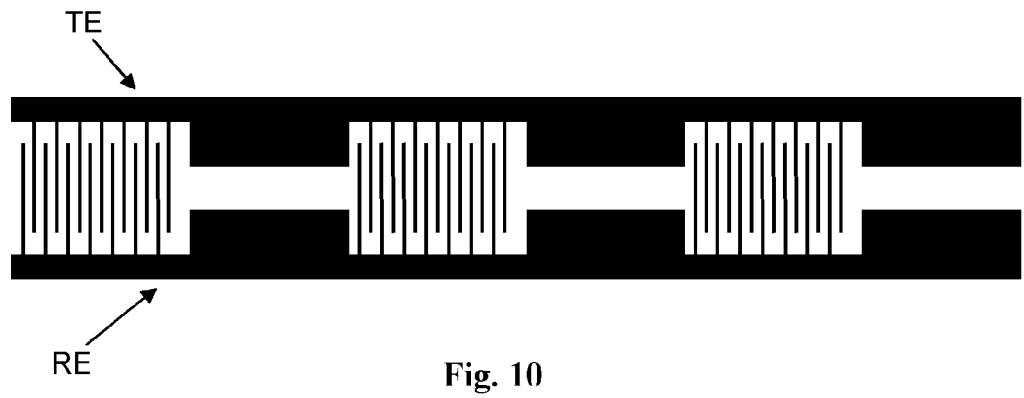
FIG. 10 an alternative embodiment of an electrode configuration.

FIG. 10 shows a further embodiment of an electrode configuration, comprising several first sensor areas and several second sensor areas. For the embodiment shown in FIG. 10 it may be advantageous to provide several decision thresholds for the reduction and several decision thresholds for the transmission for the detection of an approximation (cf. FIG. 4). When a finger approximates to a first sensor area (in which the reduction effect is achieved), the value falls below a first decision threshold for the reduction. When a second finger also approximates to another first sensor area, the reduction effect is increased so that the value also falls below a second decision threshold for the reduction. When a third finger also approximates to another first sensor area, the reduction effect is even more increased so that the value also falls below a third decision threshold for the reduction. The same applies to the approximation of the finger(s) to the second sensor areas(s), wherein the transmission effect is increased as the number of fingers increase.

A so-called safety switch can, for instance, be implemented by means of the embodiment shown in FIG. 10, which can be used to unlock the key lock of a cell phone.

It may, for instance, be intended that a user at first applies two fingers on two first sensor areas and then moves the two fingers towards two second sensor areas. This course of movement would cause the value to at first fall below the second decision threshold for the reduction before the value exceeds the second decision threshold for the transmission.

It may also be intended that a user at first applies three fingers on three first sensor areas and then simultaneously moves the three fingers towards the three second sensor areas. This way, the distance of the signal levels between reduction and transmission can be maximized, resulting in a more reliable detection.

A safety switch implemented this way has the advantage that, for instance, an unintended unlocking of the key lock of a cell phone, such as by an object close to the safety switch, can be effectively avoided since, on the one hand, several first sensor areas have to be activated and, on the other hand, only a predetermined movement at the safety switch (moving the fingers from one sensor area to the other sensor area) leads to an unlocking of the key lock.

Figure 11:
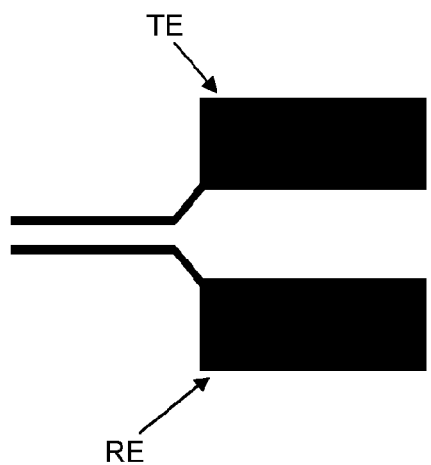
FIG. 11 a further alternative embodiment of an electrode configuration.

FIG. 11 shows a further embodiment of an electrode configuration, comprising a first sensor area and a second sensor area. The first sensor area is formed by the two small sections of the electrodes (FIG. 11, on the left). The second sensor area is substantially formed by the two large sections of the electrodes (FIG. 11, on the right). The reduction effect mentioned before is also used for the detection of an approximation to the left area and the transmission effect mentioned before is also used for the detection of an approximation to the second sensor area.

In this embodiment, it is particularly simple to arrange the shielding electrode SE (shown with reference to FIG. 5) between the two electrodes in the first sensor area.

Figure 12:
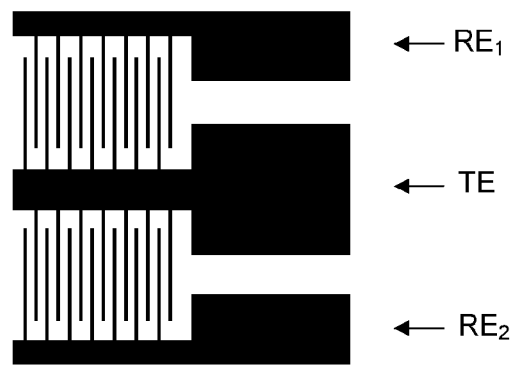
FIG. 12 an electrode configuration with three electrodes in order to implement four sensor areas or sensor zones.

FIG. 12 shows another further embodiment of an electrode configuration, defining or implementing four sensor areas by means of only three electrodes and by using the transmission effects and reduction effects mentioned before. This embodiment enables to implement the control knob shown in FIG. 8b by means of only three electrodes instead of four electrodes so that the circuit complexity can even be further reduced. This has the advantage that two receiving electrodes $RE_1$, $RE_2$ are assigned to one common transmitting electrode TE so that the electrical signals tapped at the receiving electrodes make it possible to determine to which sensor area an approximation or touch has taken place.

Figure 13:
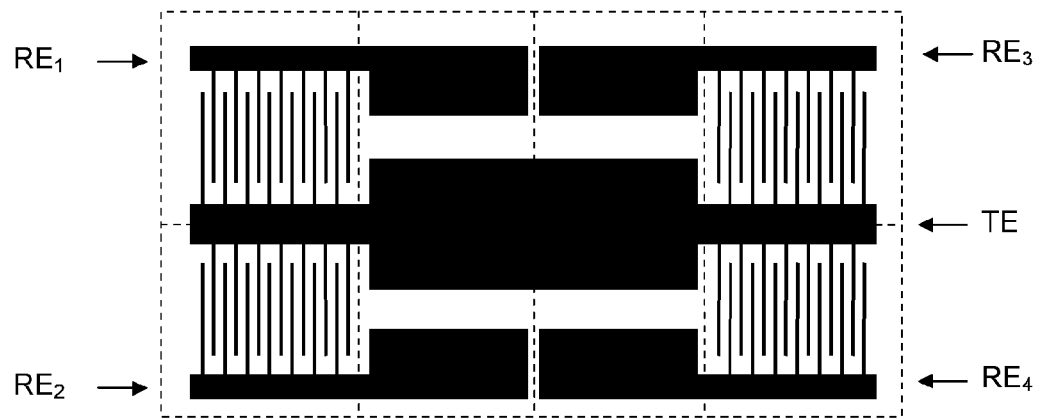
FIG. 13 an electrode configuration with five electrodes in order to implement eight sensor areas or sensor zones.

FIG. 13 shows a further development of the electrode configuration shown in FIG. 12, wherein four receiving electrodes $RE_1$, $RE_2$, $RE_3$, $RE_4$ are assigned to one common transmitting electrode TE so that eight sensor areas can be implemented by means of only five electrodes. The detection of an approximation to one of the eight sensor areas is performed by using the respective transmission and reduction effects in the respective sensor area.

What is claimed is:

1. An electrode configuration for a capacitive sensor device associated with an operating surface, comprising a transmitting electrode and a receiving electrode, wherein the transmitting electrode has a capacitive coupling with the receiving electrode, wherein the electrode configuration comprises at least one first sensor area and at least one second sensor area, wherein both electrode surfaces of the transmitting electrode and of the receiving electrode in the first sensor area are small compared to the electrode surfaces of the transmitting electrode and of the receiving electrode in the second sensor area, wherein the first sensor area defines a first button on the operating surface and the second sensor area defines a second button adjacent the first button on the operating surface, wherein when an object approaches or touches the first sensor area a first signal received at the receiving electrode is attenuated with respect to a basic coupling signal received at the receiving electrode when no object is in proximity of the respective first or second area, and when the object approaches or touches the second sensor area the signal received at the receiving electrode is increased with respect to the basic coupling signal received at the receiving electrode, wherein the sensor device thereby distinguishes between the approach or touch of the object on either the first or second button.

2. The electrode configuration according to claim 1, wherein a first distance between the transmitting electrode and the receiving electrode in the first sensor area is selected in such a way that the electrode configuration in the first sensor area shows a first capacitive basic coupling, and wherein a second distance between the transmitting electrode and the receiving electrode in the second sensor area is selected in such a way that the electrode configuration in the second sensor area shows a second capacitive basic coupling which is lower than the first capacitive basic coupling in the first sensor area.

3. The electrode configuration according to claim 1, wherein the transmitting electrode and the receiving electrode are each configured in a comb-shaped manner in the first sensor area, wherein the transmitting electrode is arranged relatively to the receiving electrode in such a way that comb teeth of the transmitting electrode are substantially arranged between comb teeth of the receiving electrode.

4. The electrode configuration according to claim 1, furthermore comprising a shielding electrode, which is substantially arranged between the transmitting electrode and the receiving electrode in the second sensor area.

5. The electrode configuration according to claim 1, wherein the transmitting electrode and the receiving electrode are each configured in a comb-shaped manner in the first sensor area and in the second sensor area, wherein the transmitting electrode is arranged relatively to the receiving electrode in such a way that the comb teeth of the transmitting electrode are substantially arranged between the comb teeth of the receiving electrode.

6. The electrode configuration according to claim 1, wherein the transmitting electrode and the receiving electrode are each configured as a first and second rectangular electrode in the first sensor area and as a third and fourth rectangular electrode in the second sensor area, wherein the first and third rectangular electrodes and the second and fourth rectangular electrodes are connected by respective coupling sections, wherein a first distance between the first and second rectangular electrodes in the first sensor area is smaller than a second distance between the third and fourth rectangular electrodes in the second sensor area.

7. The electrode configuration according to claim 1, wherein the transmitting electrode and the receiving electrode form a plurality of consecutive first and second sensor areas associated with respective consecutively arranged buttons on the operating surface.

8. A capacitive sensor device for the detection of an approximation, comprising at least one electrode configuration associated with an operating surface, wherein
the electrode configuration comprises
a transmitting electrode, at which an alternating electrical field is emitted, and
a receiving electrode, into which the alternating electrical field can is coupled and at which an electrical signal is tapped,
the electrode configuration comprises at least one first sensor area and at least one second sensor area, wherein the first sensor area defines a first button on the operating surface and the second sensor area defines a second button adjacent the first button on the operating surface, and
the transmitting electrode and the receiving electrode are configured in such a way and are arranged relatively to one another in such a way that the approximation of an object
to the first sensor area results in a level reduction and
to the second sensor area results in a level increase of the electrical signal which is tapped at the receiving electrode, wherein the capacitive sensor device is configured to distinguish between an approach or touch in either the first sensor area or the second sensor area, wherein the capacitive sensor device thereby distinguishes between the approach or touch on either the first or second button.

9. The capacitive sensor device according to claim 8, wherein in the first sensor area a first section of the alternating electrical field and in the second sensor area a second section of the alternating electrical field is formed between the transmitting electrode and the receiving electrode.

10. The capacitive sensor device according to claim 8, wherein a first distance between the transmitting electrode and the receiving electrode in the first sensor area is selected in such a way that the electrode configuration in the first sensor area shows a first capacitive basic coupling.

11. The capacitive sensor device according to claim 10, wherein a second distance between the transmitting electrode and the receiving electrode in the second sensor area is selected in such a way that the electrode configuration in the second sensor area substantially shows a second capacitive basic coupling which is lower than the first capacitive basic coupling in the first sensor area.

12. The capacitive sensor device according to claim 8, wherein the transmitting electrode and the receiving electrode are substantially configured having a planar surface and wherein both electrode surfaces of the transmitting electrode and of the receiving electrode in the first sensor area are small compared to the electrode surfaces of the transmitting electrode and of the receiving electrode in the second sensor area.

13. The capacitive sensor device according to claim 8, wherein a first distance between the transmitting electrode and the receiving electrode in the first sensor area is small compared to a second distance between the transmitting electrode and the receiving electrode in the second sensor area.

14. The capacitive sensor device according to claim 8, wherein the transmitting electrode and the receiving electrode are substantially each configured in a comb-shaped manner in the first sensor area, wherein comb teeth of the transmitting electrode are arranged between comb teeth of the receiving electrode, and wherein the transmitting electrode and the receiving electrode are substantially each configured in a rectangular way in the second sensor area, wherein backs of the comb are substantially arranged at right angles to the respective electrode.

15. The capacitive sensor device according to claim 8, wherein a shielding electrode is arranged between the transmitting electrode and the receiving electrode, wherein a first alternating electrical signal is applied to the transmitting electrode and a second alternating electrical signal is applied to the shielding electrode, wherein the first alternating electrical signal has a phase difference of 180° with regard to the second alternating electrical signal.

16. The capacitive sensor device according to claim 15, wherein the shielding electrode is arranged between the transmitting electrode and the receiving electrode in the second sensor area.

17. An electrical device, comprising at least one capacitive sensor device according to claim 8.

18. The electrical device according to claim 17, wherein the electrical device is an electrical hand-held device.

19. The capacitive sensor device according to claim 8, wherein the transmitting electrode and the receiving electrode are each configured in a comb-shaped manner in the first sensor area and in the second sensor area, wherein the transmitting electrode is arranged relatively to the receiving electrode in such a way that comb teeth of the transmitting electrode are substantially arranged between comb teeth of the receiving electrode.

20. The capacitive sensor device according to claim 8, wherein the transmitting electrode and the receiving electrode are each configured as a first and second rectangular electrode in the first sensor area and as a third and fourth rectangular electrode in the second sensor area, wherein the first and third rectangular electrodes and the second and fourth rectangular electrodes are connected by respective coupling sections, wherein a first distance between the first and second rectangular electrodes in the first sensor area is smaller than a second distance between the third and fourth rectangular electrodes in the second sensor area.

21. The capacitive sensor device according to claim 8, wherein the transmitting electrode and the receiving electrode form a plurality of consecutive first and second sensor areas associated with respective consecutively arranged buttons on the operating surface.

22. A method for operating a sensor device comprising a transmitting electrode capacitively coupled with a receiving electrode, wherein an electrode configuration comprises at least one first sensor area and at least one second sensor area, wherein electrode surfaces of the transmitting electrode and of the receiving electrode in the first sensor area are small compared to electrode surfaces of the transmitting electrode and of the receiving electrode in the second sensor area, wherein the first sensor area defines a first button on an operating surface and the second sensor area defines a second button adjacent the first button on the operating surface, the method comprising the steps of:

determining a baseline by feeding a first alternating signal to the transmitting electrode and evaluating a baseline signal received from the receiving electrode without an approximation to the first and second sensor areas;

defining a first threshold value for the first sensor area and a second threshold value for the second sensor area; and for determining a touch in the first sensor area or in the second sensor area:

feeding the first alternating signal to the transmitting electrode;

receiving a signal from the receiving electrode;

determining that the first sensor area has been touched or approached by evaluating whether the received signal is lower than the first threshold value;

determining that the second sensor area has been touched or approached by evaluating whether the received signal is higher than the first threshold value; and otherwise determining that none of the first or second sensor areas has been touched or approached.

23. The method according to claim 22, further comprising the steps of selecting a first distance between the transmitting electrode and the receiving electrode in the first sensor area in such a way that a first electrode configuration in the first sensor area shows a first capacitive basic coupling, and selecting a second distance between the transmitting electrode and the receiving electrode in the second sensor area in such a way that a second electrode configuration in the second sensor area shows a second capacitive basic coupling which is lower than the first capacitive basic coupling in the first sensor area.

24. The method according to claim 22, wherein the transmitting electrode and the receiving electrode are each configured in a comb-shaped manner in the first sensor area, wherein the transmitting electrode is arranged relatively to the receiving electrode in such a way that comb teeth of the transmitting electrode are substantially arranged between comb teeth of the receiving electrode.

25. The method according to claim 22, furthermore comprising a shielding electrode, which is substantially arranged between the transmitting electrode and the receiving electrode, the method further comprising a step of feeding a second alternating electrical signal to the shielding electrode, wherein the first alternating electrical signal has a phase difference of 180° with regard to the second alternating electrical signal.

\* \* \* \* \*

UNITED STATES PATENT AND TRADEMARK OFFICE
CERTIFICATE OF CORRECTION

PATENT NO. : 9,989,569 B2
APPLICATION NO. : 13/984112
DATED : June 5, 2018
INVENTOR(S) : Holger Erkens et al.

Page 1 of 1

It is certified that error appears in the above-identified patent and that said Letters Patent is hereby corrected as shown below:

In the Claims

Column 12,
Line 59, Claim 1, "…second sensor area, wherein both electrode surfaces of the…" ---Change to---
"…second sensor area, wherein the electrode surfaces of the…"

Column 13,
Line 64, Claim 8, "…field can is coupled and at which an electrical signal is…" ---Change to---
"…field is coupled and at which an electrical signal is…"

Signed and Sealed this
Second Day of October, 2018

Andrei Iancu
*Director of the United States Patent and Trademark Office*